United States Patent
Ono

(10) Patent No.: US 12,125,731 B2
(45) Date of Patent: Oct. 22, 2024

(54) ELECTROSTATIC CHUCK AND METHOD FOR MANUFACTURING ELECTROSTATIC CHUCK

(71) Applicant: KYOCERA Corporation, Kyoto (JP)

(72) Inventor: Hiroshi Ono, Kirishima (JP)

(73) Assignee: KYOCERA Corporation, Kyoto (JP)

(*) Notice: Subject to any disclaimer, the term of this patent is extended or adjusted under 35 U.S.C. 154(b) by 721 days.

(21) Appl. No.: 17/265,237

(22) PCT Filed: Aug. 27, 2019

(86) PCT No.: PCT/JP2019/033522
§ 371 (c)(1),
(2) Date: Feb. 2, 2021

(87) PCT Pub. No.: WO2020/045432
PCT Pub. Date: Mar. 5, 2020

(65) Prior Publication Data
US 2021/0257243 A1   Aug. 19, 2021

(30) Foreign Application Priority Data

Aug. 29, 2018 (JP) .................... 2018-160153

(51) Int. Cl.
*H01L 21/683* (2006.01)
*H01L 21/687* (2006.01)
(52) U.S. Cl.
CPC .... *H01L 21/6833* (2013.01); *H01L 21/68757* (2013.01)

(58) Field of Classification Search
CPC .............. H01L 21/6833; H01L 21/68757
See application file for complete search history.

(56) References Cited

U.S. PATENT DOCUMENTS

| | | | |
|---|---|---|---|
| 8,810,992 B2* | 8/2014 | Ono | H01L 21/6833 361/234 |
| 9,543,184 B2* | 1/2017 | Ono | H01L 21/6833 |
| 9,589,826 B2* | 3/2017 | Ono | H01L 21/68757 |
| 2004/0043230 A1* | 3/2004 | Hatono | C23C 24/04 428/458 |
| 2006/0073349 A1* | 4/2006 | Aihara | C04B 37/005 264/642 |
| 2006/0199722 A1* | 9/2006 | Aihara | C04B 35/62695 264/681 |
| 2008/0174930 A1 | 7/2008 | Hattori et al. | |
| 2009/0002913 A1* | 1/2009 | Naim | H01L 21/67109 279/128 |
| 2014/0285943 A1* | 9/2014 | Watanabe | H01L 21/6833 361/234 |

(Continued)

FOREIGN PATENT DOCUMENTS

| | | | | |
|---|---|---|---|---|
| CN | 106597697 A | * | 4/2017 | B23K 26/04 |
| CN | 110383432 A | * | 10/2019 | C23C 14/50 |

(Continued)

*Primary Examiner* — Sisay G Tiku
(74) *Attorney, Agent, or Firm* — Volpe Koenig

(57) ABSTRACT

An electrostatic chuck of the disclosure includes a ceramic base in plate form, and an electrostatic attraction electrode. The ceramic base includes a plurality of particles containing aluminum oxide as a main component. The plurality of particles contain magnesium atoms and zirconium atoms.

4 Claims, 2 Drawing Sheets

(56) References Cited

U.S. PATENT DOCUMENTS

| | | | | |
|---|---|---|---|---|
| 2018/0068883 | A1* | 3/2018 | Ito | B32B 7/04 |
| 2019/0019713 | A1* | 1/2019 | Hidaka | H01L 21/6833 |
| 2019/0043746 | A1* | 2/2019 | Yoshioka | H01J 37/3255 |
| 2019/0385884 | A1* | 12/2019 | Hidaka | C04B 35/645 |
| 2020/0211884 | A1* | 7/2020 | Hidaka | C04B 35/645 |
| 2021/0020489 | A1* | 1/2021 | Kugimoto | H01L 21/6833 |
| 2022/0223455 | A1* | 7/2022 | Hidaka | C04B 35/62807 |

FOREIGN PATENT DOCUMENTS

| | | | | |
|---|---|---|---|---|
| CN | 112510320 A | * | 3/2021 | |
| CN | 113816729 A | * | 12/2021 | |
| EP | 1602635 A1 | * | 12/2005 | C04B 35/111 |
| JP | 02-014874 A | | 1/1990 | |
| JP | 2000-313656 A | | 11/2000 | |
| JP | 2007051045 A | * | 3/2007 | C04B 35/505 |
| JP | 2008-098626 A | | 4/2008 | |
| JP | 2008-251737 A | | 10/2008 | |
| JP | 2010042967 A | * | 2/2010 | |
| JP | 5154871 B2 | * | 2/2013 | B29C 43/006 |
| JP | 5189928 B2 | * | 4/2013 | |
| JP | 2014185053 A | * | 10/2014 | H01L 21/6833 |
| KR | 10-2005-0041926 A | | 5/2005 | |
| KR | 20060092109 A | * | 8/2006 | |
| KR | 20080025012 A | * | 3/2008 | |

\* cited by examiner

ELECTROSTATIC CHUCK AND METHOD FOR MANUFACTURING ELECTROSTATIC CHUCK

CROSS-REFERENCE TO RELATED APPLICATION

This application is a national stage entry according to 35 U.S.C. 371 of International Application No. PCT/JP2019/033522 filed on Aug. 27, 2019, which claims priority to Japanese Patent Application No. 2018-160153 filed on Aug. 29, 2018, the contents of which are entirely incorporated herein by reference.

TECHNICAL FIELD

The present disclosure relates to an electrostatic chuck and a method for manufacturing an electrostatic chuck.

BACKGROUND

Among heretofore known electrostatic chucks, there are some designed for use in film-forming apparatuses such as a PVD apparatus and a CVD apparatus, or exposure apparatuses, etc. For example, an electrostatic chuck disclosed in Japanese Unexamined Patent Publication JP-A 2008-251737 (hereafter also referred to as "Patent Literature 1") is known. In a film-forming apparatus such as a PVD apparatus, a CVD apparatus, or an ion-plating apparatus, or an exposure apparatus, or also an etching apparatus, etc., for holding a workpiece such as a silicon wafer securely with high accuracy, heretofore it has been customary to carry out attraction of the workpiece to the flat, smoothly-finished surface of a member in plate form. As means for workpiece attraction, an electrostatic chuck utilizing an electrostatic attractive force has been used.

This electrostatic chuck includes a ceramic-made plate-like base including a sample holding face in one principal surface (one surface having the largest area). In the electrostatic chuck, an electrostatic attraction electrode is disposed in the interior or on the other principal surface (the other surface having the largest area) of the base. In the electrostatic chuck, a DC voltage is applied to the electrostatic attraction electrode to develop an electrostatic attractive force, such as coulomb force derived from dielectric polarization or Johnson-Rahbek force derived from minor leakage current, between the electrostatic attraction electrode and the workpiece. Thus, the electrostatic chuck enables the workpiece to be securely attracted to the sample holding face.

The electrostatic chuck is provided with a lift pin for removal of the workpiece from the sample holding face so as to protrude freely from the periphery of the sample holding face corresponding to the periphery of the workpiece.

SUMMARY

An electrostatic chuck according to the disclosure includes: a ceramic base in plate form, including one principal surface, the principal surface having a sample holding face, another principal surface, and a plurality of particles containing aluminum oxide as a main component, magnesium atoms, and zirconium atoms; and an electrostatic attraction electrode disposed in an interior or on the other principal surface of the ceramic base.

DETAILED DESCRIPTION

An electrostatic chuck 1 exemplifying the disclosure will now be described in detail with reference to drawings.

Figure 1:
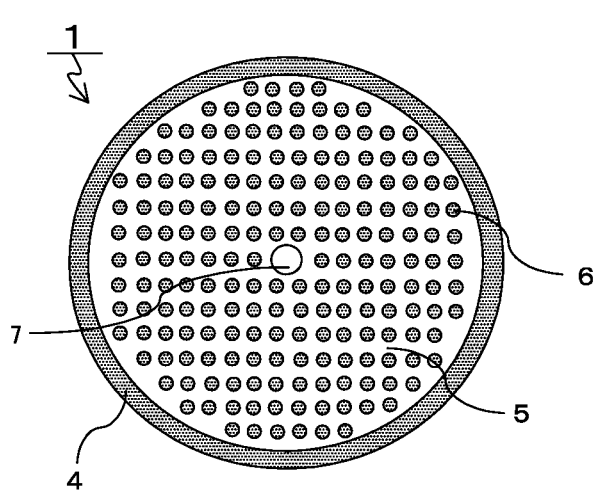
FIG. 1 is a top plan view showing an electrostatic chuck according to the disclosure.
Figure 2:
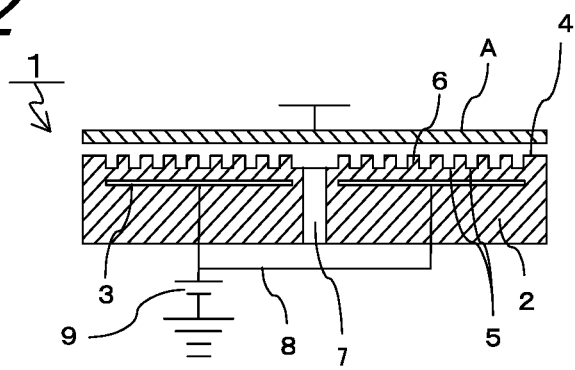
FIG. 2 is a vertical sectional view showing the electrostatic chuck according to the disclosure and a workpiece.

The electrostatic chuck 1 shown in FIGS. 1 and 2 includes a ceramic base 2 and an electrostatic attraction electrode 3. More specifically, the ceramic base 2 is shaped in a circular plate which is substantially equal in size to a workpiece A such as a silicon wafer, and the electrostatic attraction electrode 3 is embedded within the ceramic base 2.

As shown in FIG. 1, one principal surface of the ceramic base 2 is provided with many projections 6. The projections 6 each include a protruding end including a flat and smooth surface, and may constitute a sample holding face. The number of the projections 6 is not limited to the number of the projections formed in an arrangement pattern as shown in the drawing.

A lead wire 8 may be connected to the electrostatic attraction electrode 3, and the electrostatic attraction electrode 3 may be connected via the lead wire 8 to a DC power supply 9. The workpiece A, which is attracted to the sample holding face, may be either connected directly to a ground or electrically connected to a ground by using plasma. This makes it possible to develop an electrostatic attractive force between the electrostatic attraction electrode 3 and the workpiece A. As a result, the workpiece A can be securely attracted to the sample holding face.

The center of the ceramic base 2, is provided with a gas introduction hole 7 which passes through between the other principal surface (lower surface as viewed in the drawing) and one principal surface (upper surface as viewed in the drawing) thereof. Moreover, a region between the discrete projections 6 serves as a gas flow channel 5, and the gas flow channel 5 may be communicated with the gas introduction hole 7.

When the workpiece A is attracted to the sample holding face, a coolant gas such as helium gas may be supplied through the gas introduction hole 7 into a space defined by the workpiece and the gas flow channel 5. This makes it possible to improve heat transfer between the sample holding face and the workpiece A, and carry out control in such a manner as to render the workpiece temperature distribution uniform.

As shown in FIG. 1, in the electrostatic chuck 1, a circumferential wall 4 may be formed along the outer periphery of one principal surface of the ceramic base 2, and a space defined by the projection 6, the workpiece A, and the gas flow channel 5 may be a closed space. This configuration can prevents external leakage of high amounts of coolant gas supplied through the gas introduction hole 7. The circumferential wall 4 may be provided on an optional basis for intended purposes. However, the circumferential wall 4 may not be provided. Moreover, the circumferential wall 4 may be formed either integrally with or separate from the ceramic base 2.

The ceramic base 2 contains a plurality of particles containing aluminum oxide as a main component. As used herein the term "particles" refers to crystal grains constituting a polycrystalline body. While the particles contain, as a main component, aluminum oxide having a uniform atomic orientation, an accessory component which differs in atomic orientation from aluminum oxide may additionally be contained therein. As used herein the term "main component" refers to that one of the components constituting the particles which is highest in molar proportion. As will hereafter be described, the molar proportion can be determined by elemental ratio measurement using a transmission electron-microscope (TEM), energy dispersive X-ray spectroscopy (EDS), and electron energy-loss spectroscopy (EELS). Each and every particle constituting the ceramic base 2 may contain aluminum oxide as a main component. Moreover, the ceramic base 2 may contain particles containing other element than aluminum oxide as a main component. In what follows, particles containing aluminum oxide as a main component will be referred to simply as "aluminum oxide particles 10".

Figure 4:
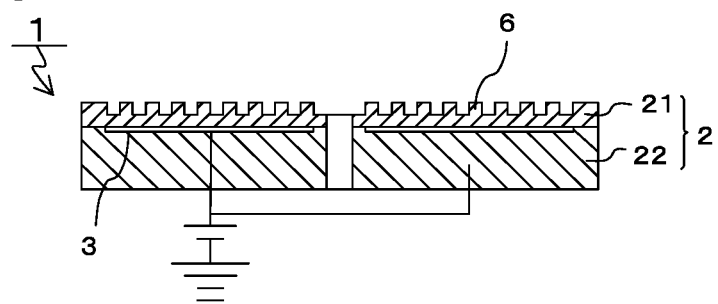
FIG. 4 is a vertical sectional view showing another embodiment of the electrostatic chuck according to the disclosure.

Exemplary of the material of construction of the electrostatic attraction electrode 3 can be metal such as platinum or tungsten. The electrostatic attraction electrode 3 may be mounted so as to be exposed at the other principal surface (lower surface) of the ceramic base 2. Moreover, as shown in FIG. 4, the electrostatic attraction electrode 3 may be located within the ceramic base 2.

In the electrostatic chuck 1 according to the disclosure, the plurality of aluminum oxide particles 10 include particles containing magnesium atoms and zirconium atoms. Thus, holes present in the ceramic base 2 can disappear by free electrons derived from solid solution of zirconium atoms in the aluminum oxide particles 10. This makes it possible to reduce residual attraction-causing holes, and thereby reduce the occurrence of residual attraction. As a result, ease of separation of a sample from the sample holding face can be enhanced.

Holes may be those that appear in the aluminum oxide particles 10 during sintering of aluminum oxide. For example, holes may be those that appear at the occurrence of a $MgO \cdot 1.7Al_2O_3$ structure (disordered spinel) during sintering of aluminum oxide at a temperature in the vicinity of 1550° C. More specifically, holes may be those denoted as "h·" in the formula of $MgO \rightarrow Mg_{AL}' + O_O^x + h·$ according to Kröger-Vink Notation.

For example, free electrons may be those generated by allowing zirconium oxide to go into solid solution in aluminum oxide. More specifically, free electrons may be those generated based on the formula of $ZrO_2 \rightarrow Zr_{AL}· + 2O_O^x + e'$.

For example, aluminum oxide powder may be of either powder of aluminum oxide prepared through bauxite refinement or powder of high-purity aluminum oxide of 99.9% by mass or more which is synthesized from a high-purity precursor such as ammonium dawsonite ($NH_4AlCO_3(OH)_2$). The aluminum oxide powder prepared through bauxite refinement may be one having a purity of 99.5% by mass or more after an ignition loss process. Aluminum oxide may be one obtained by firing a mixture of aluminum oxide powder and aluminum oxide-zirconium oxide powder. As the aluminum oxide-zirconium oxide powder, it is possible to use composite oxide powder produced by a sol-gel process as will hereafter be described.

Magnesium atoms may be those contained in magnesium oxide contained as a sintering aid in aluminum oxide. Magnesium atoms may be contained in an amount of 300 to 4600 ppm in the ceramic base 2.

Zirconium atoms may be located either near an aluminum-oxide grain boundary or within an aluminum oxide particle. Zirconium atoms may be contained in an amount of 1000 to 60000 ppm in the ceramic base 2.

It is not necessary that all of the aluminum oxide particles 10 constituting the ceramic base 2 contain magnesium atoms and zirconium atoms. Partial existence of some aluminum oxide particles 10 containing these atoms is sufficient for elimination of holes.

Figure 3:
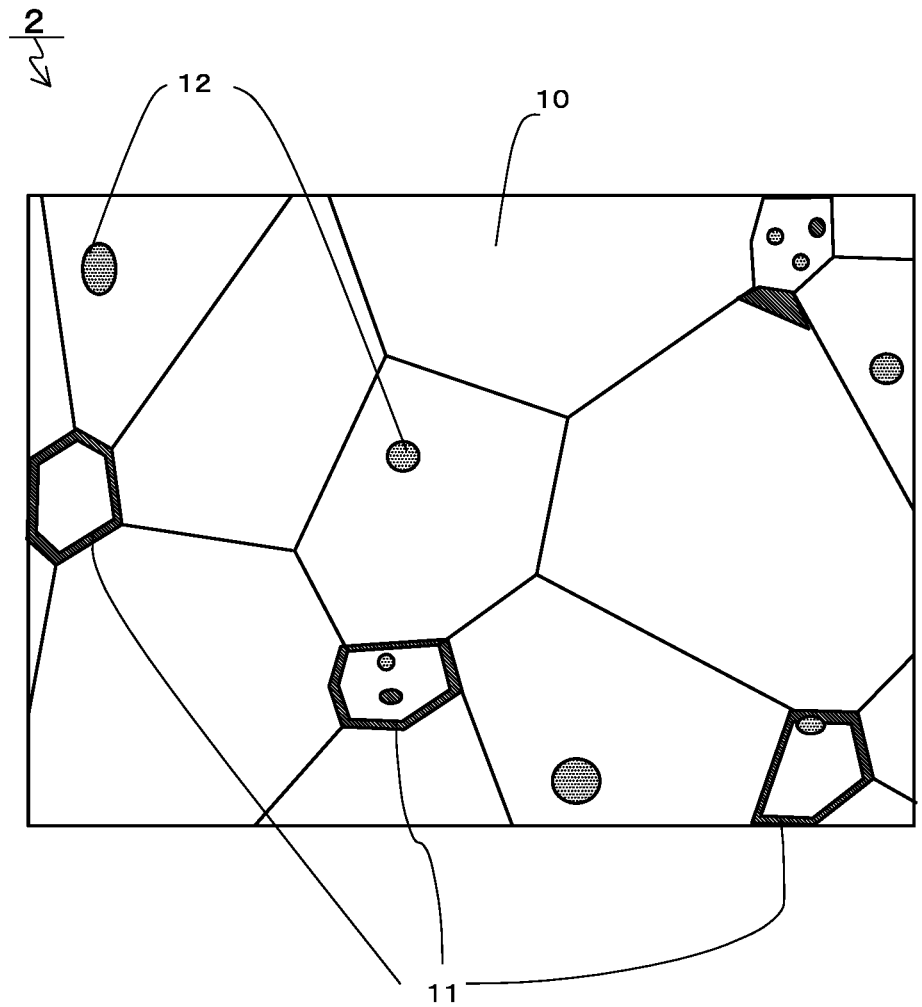
FIG. 3 is a view showing a state of the presence of aluminum oxide particles containing magnesium atoms and zirconium atoms in a ceramic base shown in FIG. 1, and also regions where these atoms are present within the particles.

FIG. 3 schematically shows an example of the state of the presence of the aluminum oxide particles 10 containing magnesium atoms and zirconium atoms in the base. In FIG. 3, diagonally shaded areas each indicate a region where zirconium atoms are present (hereafter referred to as "zirconium atom-bearing region 11"), and, the dot-pattern areas each indicate a region where magnesium atoms are present (hereafter referred to as "magnesium atom-bearing region 12"). Magnesium oxide occurring in solid solution in the aluminum oxide particles 10 forms spinel within the aluminum oxide particles 10 under interdiffusion of $Mg^{2+}$ and $Al^{3+}$. Zirconium atoms may be present in solid solution near the grain boundary of the aluminum oxide particles 10. Moreover, aluminum atom-free zirconium oxide may precipitate at an aluminum-oxide grain boundary.

In the aluminum oxide particles 10, the zirconium atom-bearing region 11 and the magnesium atom-bearing region 12 may be arranged adjacent each other. In this case, magnesium atoms responsible for the occurrence of holes and zirconium atoms responsible for the occurrence of free electrons lie close to each other. This makes it possible to reduce residual attraction-causing holes effectively, and thereby reduce the occurrence of residual attraction. As a result, ease of separation of a sample from the sample holding face can be enhanced.

Moreover, there is no need for a demarcation to exist clearly between the zirconium atom-bearing region 11 and the magnesium atom-bearing region 12. The zirconium atom-bearing region 11 and the magnesium atom-bearing region 12 may be overlapped with each other. In other words, zirconium atoms and magnesium atoms may be present in the same area.

Furthermore, in the aluminum oxide particles 10, the zirconium atom-bearing region 11 may surround the magnesium atom-bearing region 12. This makes it possible to reduce residual attraction-causing holes effectively, and thereby reduce the occurrence of residual attraction. As a result, ease of separation of a sample from the sample holding face can be enhanced.

The following structural analysis method permits determination of the inclusion of particles containing magnesium atoms and zirconium atoms in the plurality of aluminum oxide particles 10. First, a sample for analysis is obtained by taking out a predetermined portion of the ceramic base 2 by well-known means such as machining, cutting, or grinding, and thereafter making the portion into a thin piece by means of argon ion milling or otherwise. The sample thus obtained is subjected to structural analysis using a transmission electron microscope (TEM), electronic diffraction, energy dispersive X-ray spectroscopy (EDS), and electron energy-loss spectroscopy (EELS). Moreover, the above-described atoms are quantitatively measured by performing inductively coupled plasma atomic emission spectroscopy (ICP)

or atomic absorption spectroscopy on the ceramic base 2 which has been dissolved by well-known dissolving means.

As shown in FIG. 4, where the electrostatic attraction electrode 3 is embedded in the ceramic base 2, a region between the upper surface of the base 2 (the attractive faces of the projections 6 formed on the upper surface) and the electrostatic attraction electrode 3 is defined as an upper surface-side region 21. In this case, the plurality of aluminum oxide particles 10 located in the upper surface-side region 21 of the ceramic base 2 or located in the upper surface-side region 21 and nearby areas may contain magnesium atoms and zirconium atoms. This allows the following advantage to be gained: when holes occurring in a lower surface-side region 22, which is a region of the ceramic base 2 other than the region thereof which is conducive to attraction behavior, act upon the upper surface-side region 21 as minute electric current, then the holes can disappear in the presence of free electrons in the upper surface-side region 21. Thus, the occurrence of residual attraction can be reduced.

The upper surface-side region 21 may be either larger or smaller in thickness than the lower surface-side region 22. For example, the upper surface-side region 21 can be set to 0.2 to 0.4 mm in thickness, an area near the upper surface-side region 21 can be normally set to 0.1 to 0.5 mm in thickness, and the total thickness of the upper surface-side region 21 and the lower surface-side region 22 can be set to 2 to 10 mm.

Moreover, the ceramic base 2 may be configured so that the ratio of zirconium content C2 (mol) to magnesium content C1 (mol), or equivalently the atomicity ratio C2/C1, may be 1 or more.

In connection with conventional designs of the electrostatic chuck 1, there is a heretofore known technique to remove fixed charge by effecting plasma irradiation (electron implantation) of adequate duration under a DC voltage-interrupted state. There is also a disclosure about an arrangement such that the sample holding face of the ceramic base 2 is provided with a charge control electrode which is contacted by a silicon wafer attracted to the sample holding face, and functions as a ground electrode on release of the attracted silicon wafer (refer to Patent Literature 1). The use of such fixed-charge removal technique and electrostatic chuck 2 can suppress deformation and damage in a workpiece. However, over extended periods of use of the electrostatic chuck 1 containing aluminum oxide as a main component, even if irradiation of plasma (high-energy accelerated electrons) is continued for the purpose of the above-described fixed-charge removal, the residual attraction-control capability of the chuck may deteriorate with time, causing increases in residual attraction over time. This leads to difficulties in enhancing ease of separation of a sample from the sample holding face.

In the case where the ratio between magnesium content and zirconium content in the ceramic base 2 (C2/C1) is 1 or more, since the amount of zirconium oxide in solid solution is increased, much more electrons can be generated. This makes it possible to expedite the disappearance of holes occurring in the aluminum oxide particles 10 more effectively. Accordingly, it is possible to reduce increases in residual attraction under repeated voltage application with time. As a result, ease of separation of a wafer can be further enhanced. More specifically, the values of C1 and C2 can be set to $1.2 \times 10^{-5}$ to $1.9 \times 10^{-4}$ (mol).

Moreover, the ceramic base 2 may be designed so that the ratio of C2 (mol) to aluminum content C3 (mol) (C2/C3) may be 0.01 or less. This makes it possible to reduce the amount of zirconium oxide present at the grain boundary. Accordingly, it is possible to reduce the likelihood of dielectric loss tangent (tan δ) being increased due to zirconium oxide present at the grain boundary. As a result, durability of the electrostatic chuck 1 can be improved. More specifically, the value of C2 can be set to $1.2 \times 10^{-5}$ to $1.9 \times 10^{-4}$ (mol), and the value of C3 can be set to $8.9 \times 10^{-3}$ to $9.8 \times 10^{-3}$ (mol).

The following describes a method for manufacturing the electrostatic chuck 1 according to the disclosure.

A procedure in the making of the ceramic base 2 may include a step of preparing aluminum oxide-zirconium oxide powder by a sol-gel process, a step of producing a ceramic material by mixing the aluminum oxide-zirconium oxide powder and powdery aluminum oxide, and a step of firing the ceramic material.

This procedure enables zirconium oxide to go into solid solution in aluminum oxide at the stage of powder preparation. Thus, the ceramic base 2 including aluminum oxide particles 10 containing magnesium atoms and zirconium atoms can be manufactured. In the ceramic base 2, holes present in the ceramic base 2 can be eliminated by free electrons derived from solid solution of zirconium atoms in the aluminum oxide particles 10. This makes it possible to reduce residual attraction-causing holes, and thereby reduce the occurrence of residual attraction. As a result, ease of separation of a sample from the sample holding face can be enhanced.

The following describes an example of the step of preparing aluminum oxide-zirconium oxide powder by a sol-gel process. The aluminum oxide-zirconium oxide powder is prepared as follows by using a sol-gel process for mixing different metallic alkoxides or complexes that constitute an oxide precursor at the molecular level. A sol for use in the sol-gel process is produced by well-known means such as hydrolysis of metallic alkoxides or hydrolysis of metallic acetate or complexes. The following description deals with metallic-alkoxide hydrolysis by way of example.

In preparation of starting raw materials, predetermined amounts of aluminum sec-butoxide ($Al(O(CH_3)CHC_2H_5)_3$) and zirconium n-butoxide ($Zr(OC_4H_9)_4$) are weighed out, and these substances are mixed together in 2-propanol through agitation for 0.5 to 1 hour. As aluminum alkoxide and zirconium alkoxide in use, any compound containing an alkoxy group of such metals may be used without limitation to the aforenamed substances. Specific examples of alkoxy group-bearing compounds include ethoxide, n-propoxide, sec-propoxide, n-butoxide, and t-butoxide.

The compound solutions are mixed together through agitation using well-known means such as a homogenizer, a rotary agitator, or a static mixer. Since an ultrasonic homogenizer exploits cavitation effects for fracture, in particular, it is possible to use the ultrasonic homogenizer for production of fine particles in a sol-gel process which will hereafter be described.

For sufficient mixing of alkoxide solutions, it is desirable that the molar quantity of 2-propanol used as a solvent be one time or more, or 1.5 times or more the molar quantity of metallic alkoxide. The selection of the solvent may be predicated on compatibility with an alkoxy group. Thus, besides 2-propanol, an alcohol such as ethanol, n-propanol, n-butanol, 2-butanol, and t-butanol may be used for the solvent.

The resulting solution is then agitated while being maintained at a temperature which is higher than or equal to 25° C. and lower than or equal to the boiling points of metallic alkoxide and solvent in use (40° C. in this case), with drops of a mixture solution of distilled water and 2-propanol added, causing hydrolysis and polycondensation reactions of alkoxide in the solution. Under this condition, the solution undergoes solation and further undergoes gelation. In preparation of the mixture solution of water (distilled water) and 2-propanol, the water-2-propanol mixing ratio is not limited to particular values. For example, 4 to 10 moles of water (distilled water) may be admixed on the basis of 1 mole of 2-propanol. This permits preparation of a sol and a gel in a homogeneous molecular mixing state. In the interests of reaction promotion and control, an acid, e.g. hydrochloric acid or acetic acid, ammonia water, etc. may be added as a catalyst in water used for hydrolysis.

The resulting gel is continuously agitated for 0.5 to 1 hour, and then dried under reduced pressure at a temperature of 50° ° C. to 80° C., and further dried in the atmosphere at a temperature of 100° ° C. to 120° C. for 3 to 5 hours. Thus, a dried gel is obtained. The resulting dried gel has the form of a porous body which is the agglomeration of fine particles ranging from a few nanometers to several tens of nanometers in size. By well-known means such as a grinding kneader or a dry mill using balls containing metal and ceramic coated with resin e.g. urethane resin or nylon resin, the dried gel is milled into porous-gel powder having a predetermined particle size, for example, porous-gel powder capable of passing through a 330 to 500 mesh screen, and more specifically, porous-gel powder capable of passing through a mesh which is 0.025 to 0.035 mm in thread diameter, 0.026 to 0.043 mm in mesh opening, and 25.8 to 30.5% in aperture ratio.

Moreover, by carrying out agitation with an ultrasonic homogenizer in sol preparation, water splashes when falling in drops, causing fine emulsification under which hydrolysis and polycondensation occur. In this case, after a drying process, there is obtained porous fine powder having an average particle size 1 μm to 5 μm (in terms of median diameter D50).

The resulting porous powder is calcined in the atmosphere at a temperature of 500° ° C. to 1100° ° C. for 2 to 3 hours for crystallization and pore elimination, thereby producing aluminum oxide-zirconium oxide powder. The results of lattice constant measurement using X-ray diffraction and analytical process using TEM and EDS performed on this aluminum oxide-zirconium oxide powder proved formation of aluminum oxide-zirconium oxide solid solution.

The aforestated powder production method is for purposes of illustration of a specific example of the disclosure only and is not intended to be limiting of the disclosure. For example, a pH control method or spraying method may also be adopted as the powder production method for the sol-gel process.

The following describes an example of the step of producing a ceramic material by mixing the aluminum oxide-zirconium oxide powder and powdery aluminum oxide. First, predetermined amounts of the aluminum oxide-zirconium oxide powder prepared as a main aluminum oxide component by the aforestated method, powdery aluminum oxide, magnesium oxide serving as a sintering aid component, and other type of sintering aid (e.g. silicon oxide, which is added as required) are weighed out. These materials are, together with a solvent such as an ion-exchanged water or an organic solvent, an organic dispersant, and balls containing metal and ceramic such as high-purity alumina of 99.5% by mass or more which is coated with resin such as urethane resin or nylon resin, wet-milled and mixed together in a ball mill lined with resin such as urethane resin or nylon resin for 24 to 72 hours. Resin materials used for the resin lining and the resin-coated balls are suitably selected from those that are not dissolved and swollen in a solvent in use. It is preferable that the content of aluminum oxide in the fired ceramic base is at least 99.5% by mass or more from the standpoint of high specific volume resistivity.

Note that resin materials used for the resin lining and the resin-coated balls are suitably selected from those which fulfill the requirement that a non-metallic catalyst be used when the need for using a polymerization catalyst arises in resin preparation, and also fulfill the resin characteristic requirements of non-dissolubility and non-swellability to a solvent in use.

In the process of milling the raw materials, a slurry of the raw materials is picked out halfway through the process and upon completion of the process, and measurement is made on the slurry by using a laser diffraction-scattering method for control of the particle size of the powdery materials contained in the slurry. The particle size control is executed in such a manner that D10 (corresponding to 10% particle size) falls in a range of 0.1 to 0.5 μm, or in a range of 0.2 to 0.4 μm, or also in a range of 0.3 to 0.4 μm, and D50 (median diameter corresponding to 50% particle size) falls in a range of 0.4 to 0.9 μm, or in a range of 0.5 to 0.8 μm, or also in a range of 0.5 to 0.6 μm.

Following the milling and mixing process, the resulting raw-material slurry is admixed with predetermined amounts of an organic binder such as polyvinyl alcohol, polyvinyl butyral, or acrylic resin, and a plasticizer and an antifoam agent used as auxiliary organic materials. The resulting admixture is subjected to a mixing process for 24 to 48 hours.

The organic materials, including the organic binder, the plasticizer, and the antifoam agent, can be selected from those in which alkaline metal and alkaline rare-earth metal are present at 100 ppm or less, or 50 ppm or less, or also 10 ppm or less. The use of such a material allows effective reduction in the amount of residual metal at the grain boundary of aluminum oxide ceramic during sintering, and thus reduce the adverse effects of ion migration caused when DC high voltage is applied to the ceramic base 2.

The resulting organic-inorganic slurry mixture is shaped into ceramic green sheets each having a thickness of 20 μm to 20 mm, or, in particular, a thickness of 100 μm to 300 μm, by means of the doctor blade method, the calender roll method, the press molding method, the extrusion molding method, or otherwise.

Then, for the formation of the electrostatic attraction electrode 3, for example, a platinum- or tungsten-made electrode material in paste form is formed on a ceramic base 2-forming ceramic green sheet by printing using well-known means such as screen printing technique.

Then, a ceramic green sheet free of the printed pasty electrode material and an electrode-forming green sheet bearing the printed pasty electrode material are stacked one upon another into a laminate in a manner permitting formation of the electrostatic attraction electrode 3 at a predetermined location of the ceramic base 2. The stacking is done at a predetermined temperature under application of a pressure of a level greater than or equal to the yield stress value of the ceramic green sheet. As means for pressure application, well-known technique, e.g. uniaxial pressing method or isostatic pressing method (dry bag process or wet bag process) may be applied.

Lastly, an example of the step of firing the ceramic material will now be described. The resulting laminate is fired at a predetermined temperature in a range of 1530° ° C. to 1600° C. in the atmosphere or under an inert gas atmosphere for 2 to 6 hours, so that its bulk density measured in accordance with Archimedes' principle becomes at least 98% or more, or 99.5% or more in terms of relative density with respect to a theoretical density.

This is the way of producing the ceramic base 2 with the electrostatic attraction electrode 3 embedded therein. As a rule, the projections 6 for placement of an object to be held and the gas flow channel 5 are formed in the sample holding face of the ceramic base 2. Examples of well-known technique used for the formation include sandblasting using a mask, machining work, and ultrasonic machining. Thereby, for example, projections 6 having the height of 3 to 50 μm may be formed in a desired arrangement pattern.

The manufacturing method thus far described permits production of the electrostatic chuck 1 that inhibits residual attraction from increasing over time, ensuring ease of separation of a workpiece for a long period of time.

Example 1

The electrostatic chuck 1 according to the disclosure configured as shown in FIG. 1 was produced in the following manner. That is, a predetermined amount of each of the following materials was weighed out: aluminum oxide-zirconium oxide powder (having an average particle size of 1.5 μm in terms of median diameter D50) prepared by the above-described sol-gel process; aluminum oxide powder of 99.5% by mass or more (having an average particle size of 0.5 μm in terms of median diameter D50); magnesium oxide powder serving as a sintering aid component (having an average particle size of 1.5 μm in terms of median diameter D50); and other type of sintering aid (silicon oxide, calcium carbonate).

These powdery raw materials, with toluene in an amount of 80 parts by mass and a dispersant in an amount of 0.5 parts by mass added with respect to 100 parts by mass of the raw material powders in total, and 20 mm-φ resin-coated balls were wet-milled and mixed together in a nylon-lined ball mill for 48 hours.

The slurry obtained by the above-described wet milling-mixing process was admixed with a plasticizer and a binder. As the plasticizer, DBP and DOP were each added in an amount of 2 parts by mass, and, as the binder, polyvinyl butyral was added in an amount of 15 parts by mass on a solid content basis with respect to 100 parts by mass of the powdery raw materials. These materials were further wet-mixed together for 30 hours.

The resulting organic-inorganic slurry mixture was shaped into ceramic green sheets each having a thickness of 100 μm by using the doctor blade method.

Next, a tungsten paste for forming the electrostatic attraction electrode 3 was formed on a ceramic base-forming ceramic green sheet by printing using the screen printing technique.

Next, a ceramic green sheet free of the printed tungsten paste and an electrode-forming green sheet bearing the tungsten paste were stacked on top of one another into a laminate in a manner permitting formation of the electrostatic attraction electrode 3 at a predetermined location of the ceramic base. The stacking was done at a temperature of 80° C. or higher under application of a pressure of a level greater than or equal to the yield stress value of the ceramic green sheet, to be more specific, a pressure of 5 MPa, by using the uniaxial pressing method.

Next, the resulting laminate was fired in a reducing atmosphere at a temperature of 1550° C. for 3 hours.

The resulting ceramic base was subjected to a rotary grinding process for thickness adjustment, and the gas introduction hole 7 was formed in the substrate by machining work. The sample holding face of the base was lapped to 0.1 μm or less in surface roughness Ra, and also the projections 6 having a height of 15 μm were formed in a predetermined arrangement pattern by sandblasting using a mask. Moreover, a metallic terminal (not shown in the drawing) was brazed to the electrostatic attraction electrode. In this way, the electrostatic chuck 1 was produced.

There were prepared Sample Nos. 1 through 11 including alumina ceramic-made ceramic bases that vary in aluminum molar proportion, magnesium molar proportion, and zirconium molar proportion. Then, measurement of residual attractive force was made on each sample. More specifically, in a vacuum chamber which was evacuated to $1 \times 10^{-3}$ Pa, each sample was heated by a halogen lamp so that the temperature of the sample holding face of the electrostatic chuck 1 reaches 140° C.

For performance evaluations, measurement of the initial residual attraction in the electrostatic chuck 1 was carried out first in the following manner. That is, a voltage of predetermined level was applied to the electrostatic attraction electrode 3 for 300 seconds to hold a workpiece (silicon wafer), and, after a lapse of 1 second since the interruption of voltage application to the electrostatic attraction electrode 3, measurement of residual attractive force was carried out by using a load cell.

Subsequently, measurement of variations in residual attraction resulting from long-term use was made on the same electrostatic chuck 1. That is, with the electrostatic chuck 1 set within the described vacuum chamber, a voltage of predetermined level was applied to the electrostatic attraction electrode 3 to allow the sample holding face to attract and hold a workpiece for 30 minutes, and thereafter the voltage application to the electrode 3 was interrupted. After 1000 repetitions of this voltage-application and interruption cycle, the residual-attraction variation measurement was carried out in a manner similar to that for the described initial residual-attraction measurement.

In the case where attractive force under the condition where no voltage application was applied at all was measured using a load cell, the value of an attractive force was about 0.2 kPa. Accordingly, it was determined that no attractive force exists where measured values are less than or equal to 0.2 kPa.

Moreover, all samples except Sample No. 1 and Sample No. 3 were evaluated for dielectric loss tangent in the following manner. That is, after completion of the residual attraction evaluation, measurement of dielectric loss tangent (tan δ) at 1 MHz was made on a 1 mm-thick ceramic portion 60 mm per side cut from a part of the ceramic base 2 located immediately below the electrostatic attraction electrode 3 in conformance with JIS C2141. The result is shown in Table 1.

TABLE 1

| Sample No. | Aluminum oxide content in Ceramic base [% by mass] | Proportions of three components in Ceramic base [% by mole] | | | Molar ratio C2/C1 | Molar ratio C2/C3 | Residual attractive force [kPa] | | Dielectric loss tangent (tan δ) [×10⁻⁴] |
|---|---|---|---|---|---|---|---|---|---|
| | | C1 Magnesium | C2 Zirconium | C3 Aluminum | | | Initial value | Post-1000 cycle value | |
| *1 | 99.9 | 0.06 | 0 | 99.94 | 0 | 0 | 0.9 | — | — |
| 2 | 99.8 | 0.06 | 0.06 | 99.98 | 1.0 | 0.001 | 0.1 | 0.1 | 0.5 |
| *3 | 99.5 | 0.14 | 0 | 99.86 | 0 | 0 | 2.1 | — | — |
| 4 | 99.5 | 0.14 | 0.07 | 99.79 | 0.5 | 0.001 | 0.1 | 0.3 | 1.2 |
| 5 | 99.5 | 0.14 | 0.14 | 99.72 | 1.0 | 0.001 | 0.1 | 0.1 | 1.6 |
| 6 | 99.6 | 0.08 | 0.08 | 99.84 | 1.0 | 0.001 | 0.1 | 0.1 | 0.7 |
| 7 | 97.5 | 0.08 | 0.82 | 99.10 | 10.3 | 0.008 | 0.1 | 0.1 | 2.0 |
| 8 | 97.5 | 0.08 | 0.99 | 98.93 | 12.4 | 0.010 | 0.1 | 0.1 | 2.0 |
| 9 | 96.5 | 0.08 | 1.43 | 98.49 | 17.9 | 0.015 | 0.2 | 0.2 | 5.6 |
| 10 | 91.5 | 0.07 | 3.47 | 96.46 | 49.6 | 0.036 | 0.2 | 0.2 | 10. |
| 11 | 90.6 | 0.99 | 0.98 | 98.03 | 1.0 | 0.010 | 0.2 | 0.2 | 3.6 |

It will be seen from Table 1 that, in Sample No. 1 and Sample No. 3 that do not fulfill the condition that the aluminum oxide particles 10 contain magnesium atoms and zirconium atoms, the initial value of residual attractive force is 0.9 kPa or more. On the other hand, in Sample No. 2 and Sample Nos. 4 through 11 containing magnesium atoms and zirconium atoms, the initial value of residual attractive force can be as small as 0.2 kPa or less. Thus, the electrostatic chuck 1 exemplifying the disclosure is capable of reducing the occurrence of residual attraction, ensuring enhanced ease of separation of a sample from the sample holding face.

Moreover, as shown in Table 1, Sample No. 4 having a molar ratio C2/C1 of less than 1 is lower in the amount of zirconium oxide in solid solution, and will thus presumably undergo a gradual accumulation of holes during long-term use, causing residual attraction.

On the other hand, Sample No. 2 and Sample Nos. 5 through 11 are higher in the amount of zirconium oxide in solid solution, and thus exhibit greater hole-eliminating capability even after long-term use, ensuring reduced residual attractive force after 1000 cycles of operation. This is because these samples include many aluminum oxide particles 10 containing magnesium atoms and zirconium atoms. Thus, the electrostatic chuck 1 exemplifying the disclosure, being configured so that the molar ratio C2/C1 is greater than or equal to 1, is capable of reducing the occurrence of residual attraction over time, ensuring more efficient enhancement in ease of separation of a sample from the sample holding face.

Moreover, as shown in Table 1, in Sample No. 9 and Sample No. 10 having a molar ratio C2/C3 of greater than 0.01, the value of dielectric loss tangent was $5.6 \times 10^{-4}$ or more. On the other hand, in Sample No. 2 and Sample Nos. 4 through 8 having a molar ratio C2/C3 of less than or equal to 0.01, the value of dielectric loss tangent was $2.0 \times 10^{-4}$ or less. Thus, the electrostatic chuck 1 according to the disclosure, being configured so that the molar ratio C2/C3 is less than or equal to 0.01, is capable of reducing increases in dielectric loss tangent, ensuring greater durability.

Moreover, in Sample No. 11 having a molar ratio C2/C3 of 0.01 or less, although the ceramic base has an aluminum oxide content of as low as 90.6% by mass, the value of dielectric loss tangent is $3.6 \times 10^{-4}$ or below. Such a ceramic base 2 having a low aluminum oxide content may undergo increases in dielectric loss tangent under the influence of voids, etc. However, on the strength of its having a molar ratio C2/C3 of 0.01 or less, the ceramic base 2 succeeds in reducing increases in dielectric loss tangent.

In the structural analyses performed on Sample No. 2 and Sample Nos. 4 through 11 by means of TEM, EDS, and EELS, each sample was checked on the inclusion of particles containing magnesium atoms and zirconium atoms in the aluminum oxide particles 10. These atoms were present in the form shown in FIG. 3. That is, zirconium atoms were present near an aluminum-oxide grain boundary, and magnesium atoms were present within an aluminum oxide particle, or present, like zirconium atoms, near the grain boundary.

Hence, holes h• attributed to disordered spinel are electrically immobilized by free electrons e' derived from zirconium atoms during grain boundary migration, with consequent reduction in residual attraction.

REFERENCE SIGNS LIST

1: Electrostatic chuck
2: Ceramic base
3: Electrostatic attraction electrode
4: Circumferential wall
5: Gas flow channel
6: Projection
7: Gas introduction hole
8: Lead wire
9: DC power supply
10: Aluminum oxide particle
11: Zirconium atom-bearing region
12: Magnesium atom-bearing region
21: Upper surface-side region
22: Lower surface-side region

The invention claimed is:
1. An electrostatic chuck, comprising:
a ceramic base in plate form, comprising:
  one principal surface, the principal surface having a sample holding face,
  another principal surface,
  a plurality of particles comprising aluminum oxide as a main component, the plurality of particles including magnesium atoms, and zirconium atoms as a solid solution in the aluminum oxide,
  zirconium atom-bearing regions where the zirconium atoms are present, and
  a magnesium atom-bearing region where the magnesium atoms are present, wherein the magnesium atom-bearing region is surrounded by some zirconium atom-bearing regions; and an electrostatic attraction electrode disposed in an interior of the ceramic base or on the other principal surface of the ceramic base.

2. The electrostatic chuck according to claim 1, wherein the ceramic base is configured so that a ratio of zirconium content C2 (mol) to magnesium content C1 (mol), C2/C1 is 1 or more.

3. The electrostatic chuck according to claim 2, wherein the ceramic base is configured so that a ratio of the zirconium content C2 (mol) to aluminum content C3 (mol), C2/C3 is 0.01 or less.

4. The electrostatic chuck according to claim 1, wherein the electrostatic chuck has a residual attractive force of 0.2 kPa or less.

* * * * *